United States Patent [19]
Yamanouchi

[11] Patent Number: 5,344,745
[45] Date of Patent: Sep. 6, 1994

[54] METHOD FOR THE MANUFACTURE OF SURFACE ACOUSTIC WAVE TRANSDUCER

[76] Inventor: Kazuhiko Yamanouchi, 13, Matsugaoka 37-chome, Sendai-shi, Miyagi 982, Japan

[21] Appl. No.: 16,716

[22] Filed: Feb. 11, 1993

Related U.S. Application Data

[60] Division of Ser. No. 853,882, Mar. 18, 1992, abandoned, which is a continuation of Ser. No. 476,444, May 31, 1990, abandoned.

[30] Foreign Application Priority Data

Oct. 16, 1988 [JP] Japan .................................. 63-260210
Oct. 11, 1989 [JP] Japan .................................. 1-264717

[51] Int. Cl.$^5$ ................................................ G03C 5/00
[52] U.S. Cl. ...................................... 430/315; 430/313; 430/317; 310/313 R; 310/313 B; 310/370
[58] Field of Search ............... 430/315, 313, 311, 317; 310/313 B, 313 R, 365, 370

[56] References Cited

U.S. PATENT DOCUMENTS 4,820,612 4/1989 Mase et al. ........................... 430/315
4,906,885 3/1990 Kojima ................................. 310/363

Primary Examiner—Steve Rosasco
Attorney, Agent, or Firm—Koda and Androlia

[57] ABSTRACT

In a surface acoustic wave transducer having closely space-apart IDT electrode segments, a metallic oxide is selectively formed only along the marginal edge of each electrode segment so that it separates adjacent electrode segments, thereby preventing short-circuiting therebetween, permitting easy fabrication of the transducer and improving the yield rate of fabrication.

3 Claims, 4 Drawing Sheets

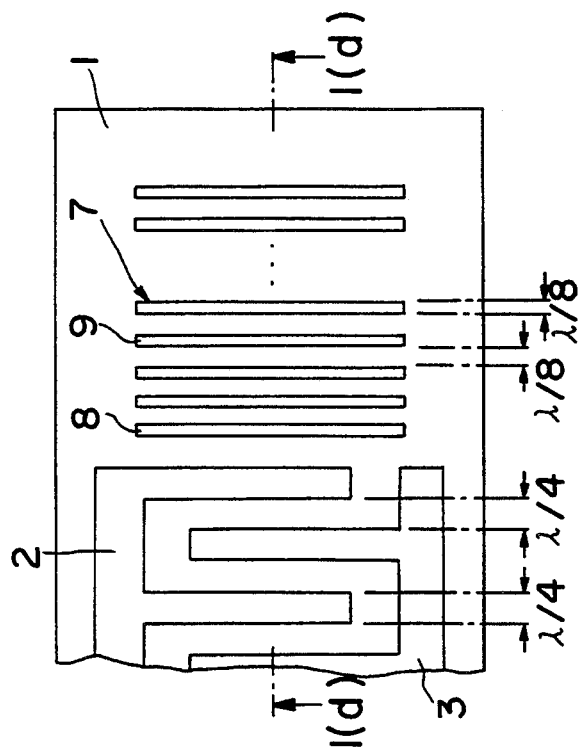
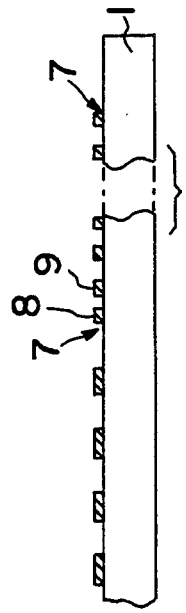
FIG.1(c)
FIG.1(d)
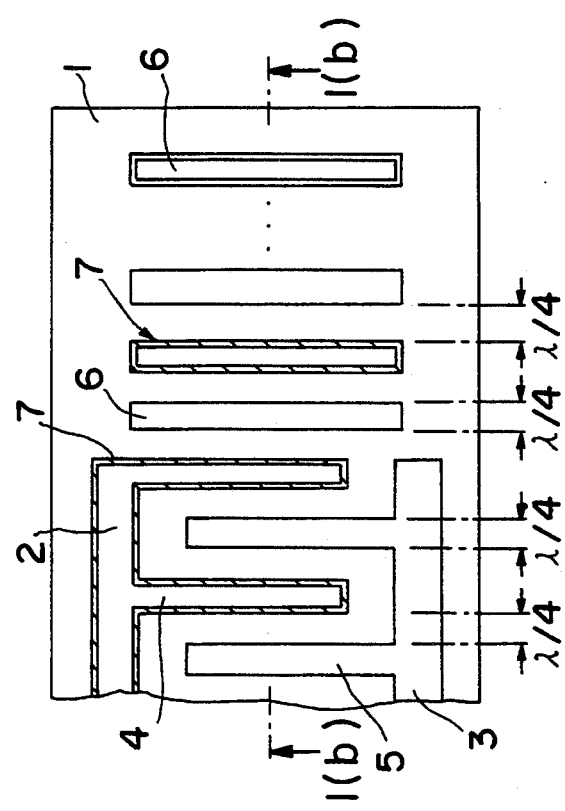
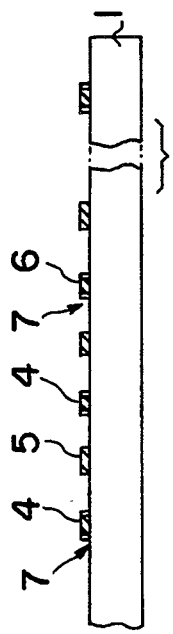
FIG.1(a)
FIG.1(b)

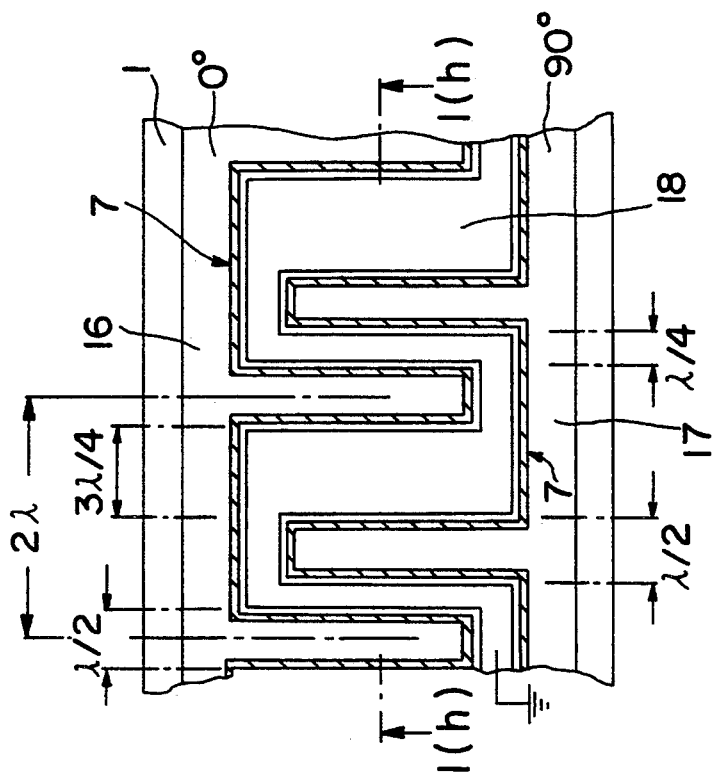
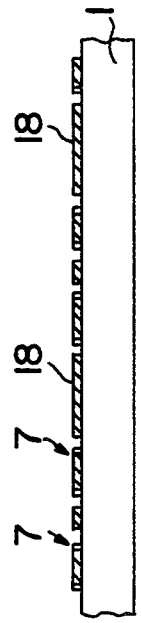
FIG.1(g)  FIG.1(h)
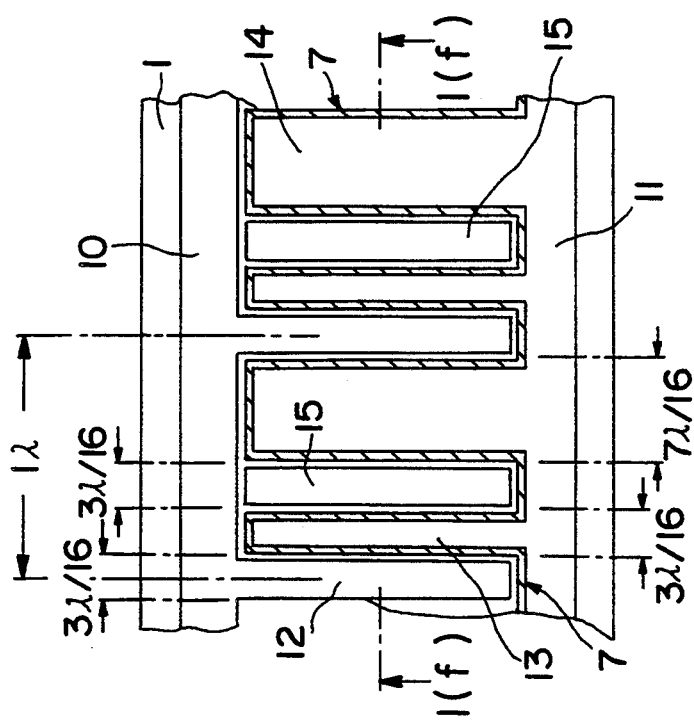
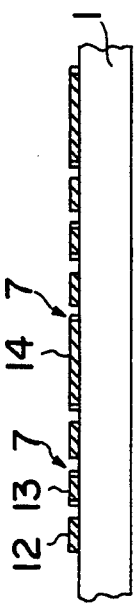
FIG.1(e)  FIG.1(f)

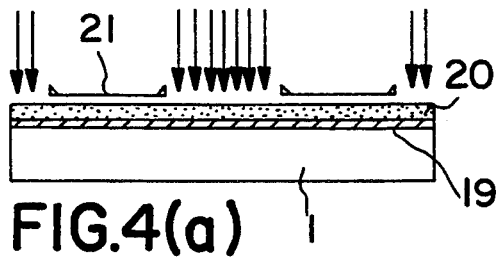
FIG.4(a)
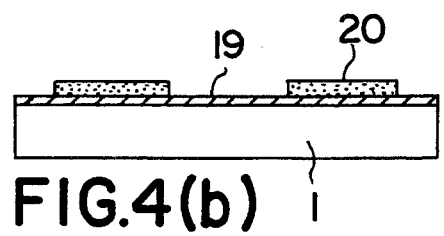
FIG.4(b)
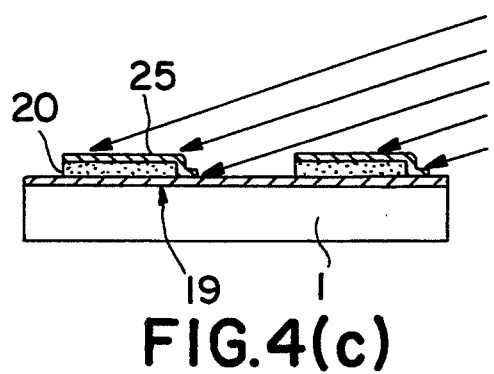
FIG.4(c)
FIG.4(d)
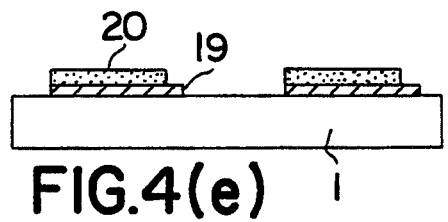
FIG.4(e)
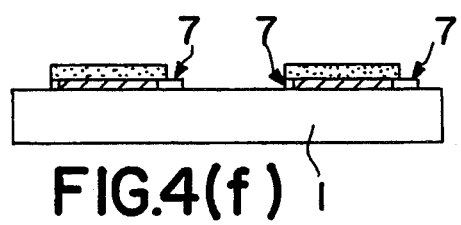
FIG.4(f)
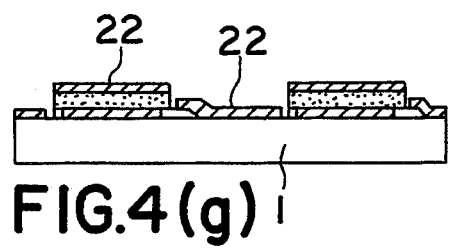
FIG.4(g)
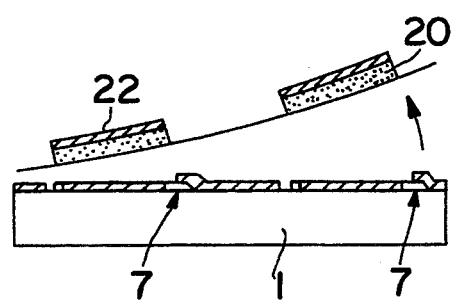
FIG.4(h)

METHOD FOR THE MANUFACTURE OF SURFACE ACOUSTIC WAVE TRANSDUCER

This is a division of application of Ser. No. 853,882, filed Mar. 18, 1992 now abandoned, which is a continuation of Ser. No. 07/476,444, filed May 31, 1990, now abandoned.

TECHNICAL FILED

The present invention relates to a structure for preventing shorts of adjacent IDT (Inter-Digital Transducer) electrode segments (including floating electrodes, meander lines, or reflector strips) in a surface acoustic wave transducer in which the IDT elctrode segments are closely spaced or their spacing is small as compared with the width of each electrode segment. The invention also pertains to a method for the manufacture of such a surface acoustic wave taransducer.

PRIOR ART

As is well-known in the art, in a so-called surface acoustic wave transducer which has IDT electrodes deposited on a piezoelectric substrate and excites surface acoustic waves in the substrate surface by applying an alternating electric field to the electrodes or receives a surface acoustic wave signal having propagated thereto and transduces it into an electric signal, the center frequency of the transducer is determined by the pitch of the IDT electrode segments. In devices employing the inter-digital transducer (hereinafter referred to as the IDT) the width of each of the electrode segments and their spacing are usually selected substantially equal to each other for various reasons.

Today when various pieces of electronic equipment are being developed for operation at higher frequencies, center frequencies of the devices employing the IDT also need to be raised accordingly. This inevitably calls for reduction of the pitch of the electrode segments, and consequently, the corresponding reduction of the width of each segment and their spacing as well.

The deposition of such closely spaced IDT electrodes by photolithography necessitates the use of a photomask having very narrow slits, but the formation of such a photomask is very difficult and eventually raises manufacturing costs of surcace acoustic wave transducers.

As a solution to this problem, the inventor of this application has proposed, in the field of a "unidirectional surface acoustic wave filter", a surface acoustic wave transducer in which the width of each electrode segment is sufficientlly larger than their spacing (see Japanese Pat. Appln. No. 22380/88).

With such a structure, however, conventional surface acoustic wave transducers using the IDT electrodes with closely spaced electrode segments still often suffer short-circuiting of adjacent electrodes during manufacture, which ruins the devices; hence they are extremely low in the yield rate of product.

It is therefore an object of the present invention to provide a surface acoustic wave transducer of a structure which is free from shortcircuiting of closely spaced electrode segments, easy to manufacture, and hence is high in the yield rate of product.

Another object of the present invention is to provide a method for the manufacture of such a surface acoustic wave transducer.

To attain the above objective, according to the present invention, marginal edges of adjoining electrode segments are separated by a metallic oxide which is a dielectric material, and the metallic oxide is selectively formed only at the marginal edges of the electrode segments in the course of manufacture of the surface acoustic wave transducer.

Accordingly, the present invention is very effective in preventing shorts of the electrode segments in the manufacture of a resonator which is required to be high in its resonance frequency or a unidirectional transducer in which the electrode segments are widened and closely spaced apart with a view to facilitating its fabrication.

With the manufacturing method of the present invention, partitions of a dielectric material can each be provided between adjacent electrode segments in the step of their formation. Further, since the IDT electrode segments are mostly formed as a unitary structure, they can be made dielectric at required positions at one time by anodic oxidation. Accordingly, the method of the present invention permits easy and low-cost fabrication of the above-mentioned transducer.

BRIEF DESCRIPTION OF THE DRAWINGS

FIGS. 1(a) and (b), (c) and (d), (e) and (f), and (g) and (h) are plan and sectional views respectivelly illustrating different embodiments of the surface acopustic wave transducer of the present invention; FIGS. 4(a) through (h) are sectional views showing the steps involved in producing the transducer depicted in FIG. 3.

BEST MODE FOR CARRYING OUT THE INVENTION

Figure 2A:
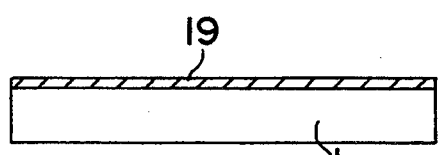
FIGS. 2(a) throgth (g) are sectional views showing a sequence of steps involved in the manufacture of the transducers depicted in FIG. 1.
Figure 2E:
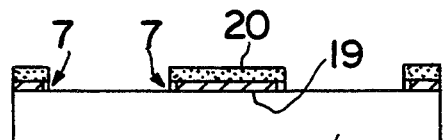
Figure 2B:
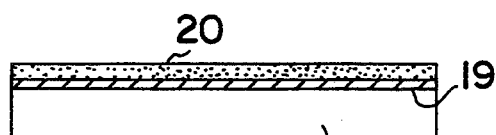
Figure 2F:
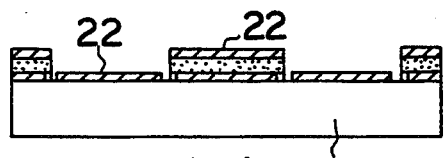
Figure 2C:
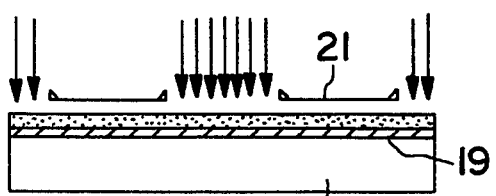
Figure 2G:
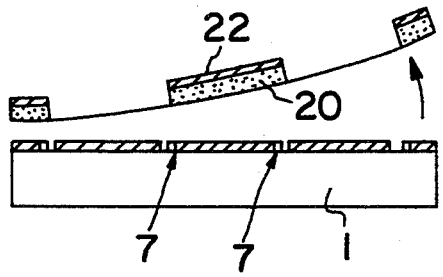
Figure 2D:
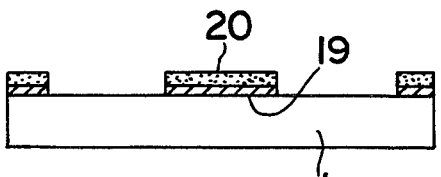

The present invention will hereinafter be described in detail in connection with the embodiments shown in the drawings.

FIGS. 1(a) through (h) are plain and sectional views illustrating the structures of four typical surface acoustic wave devices embodying the present invention.

FIGS. 1(a) and (b) show an ordinary surface acoustic wave resonator, in which electrode segments 4, 4, . . . and 5, 5, . . . of a pair of IDT electrodes 2 and 3 and reflecting strips 6, 6, . . . are arranqed on a piezoelectric substrate 1 in side-by-side relation in the direction of propagation of surface acoustic waves which are excited by the electrode segments 4 and 5. The electrode segments 4 and 5 and the reflecting strips 6 each have a width equal to and are spaced a distance of $\gamma/4$ (where $\gamma$ is the wavelength of the excited surface acoustic waves) apart.

If the resonator of such an electrode arrangement is required to have a high resonance frequency, the widths of the electrode segments 4 and 5 and the reflecting strips 6 and their spacing will have to be reduced, and consequently, adjacent electrode segments will be more likely to short as referred to previously.

To avoid this, in the surface acoustic wave transducer (a resonator, in this instance) of the present invention marginal edges of the electrode segments 4, 4, . . . of the IDT electrode 2 and half of the reflecting strips 6, 6, . .

are oxidized or anodized to form metallic oxides 7, 7, . . . as shown in FIGS. 1(a) and (b).

FIGS. 1(c) and (d) show what is called a "positive-negative reflection type surface acoustic wave resonator" in which reflector strips are slightly modified for improving the $\Omega$ of the resonator, that is, aluminum (Al) and gold (Au) strips 8 and 9 of the same width $\gamma/8$ are alternately arranged at intervals of $\gamma/8$. In this type of resonator marginal edges of only the aluminum strips 8, 8, . . . ,for example, may be oxidized or anodized to form the metallic oxides 7 as shown.

FIGS. 1(e) and (f) show an internal reflection type unidirectional IDT employing floating electrodes, already proposed by the inventor of this application, in which IDT electrodes 10 and 11 have asymmetrical electrode segments 12, 12, . . . and 13, 14 and floating electrodes 15, 15, . . . each disposed between them. Owing to the asymmetry of the electrode segments, excited surface acoustic wave energies are mostly propagated in one direction. By disposing two such transducers opposite in the direction of propagation of surface acoustic waves excited by either of them (which direction is called a forward direction), a surface acoustic wave filter can be obtained which is of small insertion loss and of few ripples in its pass band.

Also in this instance, if the center frequency of the surface acoustic transducer is required to be high, the width of each electrode segment will have to be reduced, introducing difficulty in the formation of the photomask. To avoid this, the inventor of this application has proposed the transducer in which the width L of each electrode segment is increased and their spacing S is decreased correspondingly, that is, $S/L<1$, or $S/L<1$ in some cases, but such a transducer also suffers short-circuiting of adjacent electrode segments as mentioned previously.

The surface acoustic wave transducer of the present invention gets around this problem by oxidizing or anodizing marginal edges of the electrode segments of the one IDT electrode 11 to form the metallic oxide 7 as shown in FIGS. 1(e) and (f).

FIGS. 1(g) and (h) are a plain and a sectional view also showing a transdeucer embodying the present invention, called a group type unidirectional IDT, in which a conductor line 18, commonly referred to as a meander line, is disposed between a pair of IDT electrodes 16 and 17 and is grounded. In this instance, surface acoustic waves, which are excited by applying to the IDT electrodes 16 and 17 signals displaced 90° apart in phase, are in phase in the forward direction but 180° out of phase in the backward direction, so that the surface acoustic wave energy propagates in on direction.

Also in this case, marginal edges of the IDT electrode segments extending along the meander line 18 are oxidized or anodized to form the metallic oxide 7 for preventing short-circuiting between the electrode segments and the meander line.

The surface acoustic wave transducers described above can each be manufactured by such a method as shown in FIGS. 2(a) through (g).

The manufacture starts with the deposition of a metallic film 19 all over a required area of the surface of the piezoelectric substrate 1(a), followed by coating the metallic film with a photoresist 20(b). The photoresist thus coated is exposed to light through a mask 21 having slits of required widths (c) and is developed, which is followed by etching away the exposed areas of the metallic film 19(d). The marginal edges of the metallic film 19 underlying the remaining photoresist 20 are oxidized or anodized to from the metallic oxide 7(e), after which a metallic film 22 is deposited using the remaining photoresist 20 as a mask (f), and finally, the remaining photoresist 20 and the metallic fim 22 deposited thereon are removed.

Incidentally, the metallic films 19 and 22 are usually aluminum (Al) but other metals can be used. In the case of forming the reflecting strips by different metals as depicted in FIGS. 1(c) and (d), gold (Au) may be used for the metallic film 22.

Sulfuric acid is usually employed for oxidation of the aluminum (Al), and for anodic oxidation, an acid such as sulfuric acid is used in which the IDT electrodes to be anodized, for example, are disposed at the anode, with the cathode connected to an insoluble electrode (as of lead (Pb), platinum (Pt), or the like), are energized, as is well-known in the art.

Figure 3:
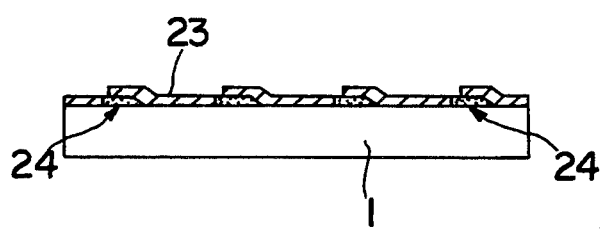
FIG. 3 is a sectional view illustrating an example of an unidirectional surface acoustic wave transducer embodying the present invention.

FIG. 3 illustrates in section another unidirectional transducer embodying the presnt invention, which has also been proposed by the inventor of this application as is the case with the embodiment shown in FIGS. 1(a) and (b). By arranging partly stepped electrode segments 23, 23, . . . at the same pith, the unidirectional transducer can be obtained without the necessity of utilizing the asymmentry of IDT electrode arrangement.

In the manufacture of such a transducer, since the prior art employs sputtering by which a cavity formed by an overhang of each stepped electrode segment is filled with $SiO_2$ or a similar dielectric material, it is difficult to deposit the $SiO_2$ accurately at the desired position, and in particular, in the case where the spacing of electrode segments is very small, adjacent electrode segments are liable to short. Hence, this structure has not as yet been put to practical use.

This problem can be solved by such a method as shown in FIGS. 4(a) through (h).

The formation of such a transducer structure begins with deposition of the metallic film 19 and the photoresist 20 over a required area of the surface of the piezoelectric substrate 1, which is followed by exposure of the photoresist 20 to light through the mask 21 having required slits (a), after which the photoresist 20 of the exposed area is developed and removed (b). Then a material which is resistant to an etchant for removing the metallic film 19 is coatd as a thin film 25 on the remaining photoresist 20 from a direction oblique to the surface of the piezoelectric substrate 1(c). Next, the exposed portion of the initially deposited metallic film 19 is etched away (d), after which the thin film 25 deposited later is also etched away (e) so that the metallic film 19 underlying the remaining photoresist 20 slightly protrudes from thereunder.

Following this, the exposed portions of the metallic film 19 are oxidized or anodized to form the metallic oxide 7, after which the metallic film 22 is deposited using the remaining photoresist 20 as a mask (g), and finally, the remaining photoresist 20 and the metallic film 22 deposited thereon are removed. In this way, the unidirectional surface acoustic wave transducer such as shown in FIG. 3 can be manufactured relatively easily.

As the material for the thin film 25 which is deposited from the direction oblique to the surface of the piezoelectric substrate 1, chromium (Cr) would be best, if aluminum (Al) is used for the initially deposited metallic film 19. These metallic films can easily be formed by vapor deposition.

The angle for the oblique vapor deposition of the chromium (Cr) depends on the height and the width of the remaining photoresist 20 and the length of the metallic film 19 protruding from under the overlying photoresist 20, but in general, the angle is in the range of between 10 to 80 degrees.

The surface acoustic wave transducer with closely spaced electrode segments according to the present invention is structured as described above. Hence, the structure of the present invention is very effective in preventing short-circuiting of adjacent electrode segments in the manufacture of a resonator which is required to have a high resonance frequency, or a unidirectional transducer, in which the electrode segments are wide but closely spaced apart for easy fabrication. With the manufacturing method of the present invention, partitions of a dielectric material can each be provided between adjacent electrode segments in the step of their formation. Further, since the IDT electrode segments are mostly formed as a unitary structure, they can be made dielectric at required positions at one time by anodic oxidation. Accordingly, the method of the present invention permits easy and low-cost fabrication of the transducers mentioned above.

AVAILABILITY FOR INDUSTRIAL APPLICATIONS

As described above, the structure for preventing short-circuiting between adjacent electrode segmens and the manufacturing method according to the present invention effectively prevents the short of the electrodes segments in surface acoustic wave transducers in which IDT electrode segments (including floating electrodes, meander lines, or reflecting strips) are closely spaced apart or their spacing is small as compared with the width of each segment. Moreover, the structure and the manufacturing method according to the present invention allows ease in the manufacture of such transducers and improves the yield rate of their fabrication.

I claim:

1. A method for manufacturing a surface acoustic wave transducer in which inter-digital transducer electrode segments themselves, or such segments and a floating electrode or meandering line disposed therebetween, or reflecting strips are closely spaced apart, comprising the steps of:

(a) depositing a metallic film over a required area of the surface of the piezoelectric substrate;

(b) depositing photoresist all over said metallic film;

(c) exposing said photoresist to light at required intervals and developing said photoresist to remove its exposed portions;

(d) etching away said metallic film exposed between the remaining portions of said photoresist;

(e) rendering only marginal edges of the metallic film underlying said remaining photoresist dielectric by oxidation or anodization to prevent short circuiting therebetween;

(f) depositing a metallic film onto the surface of said remaining photoresist and the exposed surface of said piezoelectric substrate;

(g) removing said remaining photoresist and said metallic film deposited thereon; and (h) setting the width L and the spacing S of each of adjacent interdigital transducer electrodes to satisfy the relationship $S \ll L$.

2. A method for the manufacture of a surface acoustic wave transducer according to claim 1 characterized in that said metallic film deposited first and said metallic film deposited next are formed of different materials.

3. A method for the manufacture of a surface acoustic wave transducer which has closely spaced-apart electrode segments and in which a substantially U-shaped cavity provided between at least a marginal edge of each electrode segment and a surface of a piezoelectric substrate is filled with a dielectric material, said method comprising the steps of:

(a) depositing a metallic film over a required area of said substrate surface;

(b) depositing photoresist all over said metallic film;

(c) exposing said photoresist to light at required intervals and developing said photoresist to remove its exposed portions;

(d) depositing a thin film of a material resistant to an etchant for said metallic film onto the surface and one side of said remaining photoresist from a direction oblique to said substrate surface;

(e) etching away the exposed portions of said metallic film deposited on said substrate surface between the remaining portions of said photoresist;

(f) etching away said thin film, leaving said metallic film underlying said remaining photoresist and slightly protruding from under one side thereof;

(g) rendering only the protruding portion of said metallic film dielectric by oxidation or anodization;

(h) depositing a metallic film onto the surface of said remaining photoresist, said dielectric portion protruding from under one side marginal edge of said remaining photoresist and the exposed areas of said substrate surface; and (i) removing said remaining photoresist and said metallic film deposited thereon.

* * * * *